US008934317B2

(12) United States Patent
Jeon et al.

(10) Patent No.: US 8,934,317 B2
(45) Date of Patent: Jan. 13, 2015

(54) SEMICONDUCTOR MEMORY DEVICES HAVING INTERNAL CLOCK SIGNALS AND MEMORY SYSTEMS INCLUDING SUCH MEMORY DEVICES

(71) Applicant: Samsung Electronics Co., Ltd., Suwon-si (KR)

(72) Inventors: Young Jin Jeon, Hwaseong-si (KR); Yoon Joo Eom, Hwaseong-si (KR); Young Chul Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 49 days.

(21) Appl. No.: 13/729,068

(22) Filed: Dec. 28, 2012

(65) Prior Publication Data

US 2013/0182524 A1 Jul. 18, 2013

Related U.S. Application Data

(60) Provisional application No. 61/586,301, filed on Jan. 13, 2012.

(30) Foreign Application Priority Data

Apr. 12, 2012 (KR) ........................ 10-2012-0038169

(51) Int. Cl.
*G11C 7/22* (2006.01)
*G11C 8/18* (2006.01)

(52) U.S. Cl.
CPC ........ *G11C 8/18* (2013.01); *G11C 7/222* (2013.01); *G11C 7/225* (2013.01)
USPC .............. 365/233.1; 365/189.06; 365/189.07; 365/191

(58) Field of Classification Search
CPC ........ G11C 7/22; G11C 7/1072; G11C 7/222; G11C 7/1051; G11C 11/4076
USPC ............................. 365/233.1, 18.06, 189.07
See application file for complete search history.

(56) References Cited

U.S. PATENT DOCUMENTS

| 6,438,060 | B1 | 8/2002 | Li et al. |
| 6,522,598 | B2 * | 2/2003 | Ooishi ..................... 365/189.14 |
| 7,099,234 | B2 | 8/2006 | Parris et al. |
| 7,430,143 | B2 | 9/2008 | Choi |
| 7,826,304 | B2 | 11/2010 | Jang |
| 2002/0078316 | A1 | 6/2002 | Nakamura |
| 2010/0033219 | A1 | 2/2010 | Kim |
| 2010/0156466 | A1 | 6/2010 | Freitas |

* cited by examiner

*Primary Examiner* — Jason Lappas
(74) *Attorney, Agent, or Firm* — Myers Bigel Sibley & Sajovec, P.A.

(57) ABSTRACT

A semiconductor memory device has a clock input buffer that is turned 'on' or 'off' in response to a first control signal. The clock input buffer is configured to buffer an external clock signal in order to output a buffered clock signal. The memory device further includes an internal clock generator that is configured to generate an internal clock signal in response to the buffered clock signal. The generation of the internal clock signal is started in response to a second control signal.

18 Claims, 14 Drawing Sheets

SEMICONDUCTOR MEMORY DEVICES HAVING INTERNAL CLOCK SIGNALS AND MEMORY SYSTEMS INCLUDING SUCH MEMORY DEVICES

CROSS-REFERENCE TO RELATED APPLICATIONS

This application claims priority under 35 U.S.C. §119 to U.S. Provisional Patent Application No. 61/586,301, filed on Jan. 13, 2012, in the United States Patent and Trademark Office, and to Korean Patent Application No. 10-2012-0038169, filed on Apr. 12, 2012, in the Korean Intellectual Property Office, the disclosure of each of which is incorporated herein in its entirety by reference.

BACKGROUND

The inventive concept relates to semiconductor devices, and more particularly, to semiconductor memory devices and to memory systems that include these semiconductor memory devices.

Semiconductor memory devices are used as storage devices in many, if not most, electronic systems. Dynamic random access memory (DRAM) devices refer to one particular class of semiconductor memory device that has been widely used to implement the memory systems that are used in, for example, personal computers and servers. A variety of different types of DRAM devices are known in the art including, for example, synchronous dynamic random access memory devices (SDRAM) which operate in synchronization with a system clock signal. One example of an SDRAM device is the double-date-rate (DDR) SDRAM, which delivers data in synchronization with rising and falling edges of a system clock signal. Numerous other semiconductor memory systems are known in the art including a wide variety of non-volatile memory devices such as, for example, flash memory devices, phase change memory devices, resistance memory devices and the like.

SUMMARY

One or more aspects of the inventive concept provide a semiconductor memory device that may consume a reduced amount of standby current when the memory device is in a power-down mode of operation.

One or more aspects of the inventive concept also provide a memory system that may consume a reduced amount of standby current when a memory device included therein is in a power-down mode of operation.

According to an aspect of the inventive concept, there is provided a semiconductor memory device including a clock input buffer that is turned 'on' or 'off' in response to a first control signal, the clock input buffer configured to buffer a clock signal in order to output a buffered clock signal; and an internal clock generator that is configured to generate an internal clock signal in response to the buffered clock signal, wherein the generation of the internal clock signal is started in response to a second control signal.

The first control signal may be a clock enable signal. The second control signal may be a chip selection signal. The internal clock generator may generate the internal clock signal by starting a division of the buffered clock signal in response to a first pulse of the chip selection signal being input to the internal clock generator. A pulse width of the first pulse of the chip selection signal may be greater than one clock cycle of the clock signal.

The internal clock generator may be configured to start to generate the internal clock signal by dividing the buffered clock signal in response to the first pulse of the chip selection signal being input to the internal clock generator while the clock enable signal is activated.

If the clock enable signal is activated, then the clock input buffer may buffer the clock signal.

The semiconductor memory device may further include a clock input buffer controller that is configured to turn the clock input buffer 'on' or 'off' in response to the clock enable signal. The semiconductor memory device may further include an internal clock generation controller that is configured to turn the internal clock generator 'on' or 'off' in response to the clock enable signal.

The semiconductor memory device may also include a command/address buffer that is configured to buffer a command/address signal in synchronization with the internal clock signal. The chip selection signal may include a first pulse that is provided to the internal clock generator to imitate generation of the internal clock signal, and a second pulse that is subsequent to the first pulse, and the command/address buffer may receive the command/address signal when the second pulse of the chip selection signal is input to the internal clock generator. The clock signal may include a first clock cycle that corresponds to a point of time when the first pulse occurs and a second clock cycle that occurs an even number of clock cycles after the first clock, the second clock being within a period where the second pulse is maintained.

According to an aspect of the inventive concept, there is provided a memory system including a memory controller that is configured to generate a chip selection signal including a first pulse, a clock signal, and a clock enable signal; and a memory device that is configured to start generating an internal clock signal that is based on the clock signal in response to the first pulse being input to the memory device when the clock enable signal is activated.

The chip selection signal may further include a second pulse that is subsequent to the first pulse. The clock signal may include a first clock cycle that corresponds to a point in time when the first pulse occurs and a second clock cycle that occurs an even number of clock cycles after the first clock cycle, the second clock being within a period where the second pulse is maintained. The memory controller may further include a command/address supply unit for supplying a command/address to the memory device, in synchronization with the second clock of the clock signal, while the second pulse of the chip selection signal is maintained.

The memory controller may further include a pulse width controller for controlling a pulse width of the first pulse of the chip selection signal to be greater than one clock cycle of the clock signal.

The memory device may include a clock input buffer that is 'on' or 'off' according to the clock enable signal, the clock input buffer buffering the clock signal and outputting a buffered clock signal; and an internal clock generator for generating the internal clock signal by dividing the buffered clock signal, wherein the dividing of the buffered clock signal is started based on the first pulse of the chip selection signal.

According to an aspect of the inventive concept, a semiconductor memory system is provided that includes a semiconductor memory device that has a memory cell array and an internal clock generator that is configured to generate an internal clock signal. The semiconductor memory device is configured to have a normal operating mode and a power-down operating mode. The memory system further includes a memory controller that is configured to generate and supply a first control signal, a second control signal and a command signal to the semiconductor memory device. The semiconductor memory device is configured to switch from the power-down operating mode to the normal operating mode in response to the first control signal, and is further configured to generate the internal clock signal in response to the second control signal such that the command signal is received in synchronization with the internal clock signal.

The memory device may be configured so that a clock input buffer of the semiconductor memory device is turned on in response to activation of the first control signal. The memory device may also be configured so that an internal clock generator of the semiconductor memory device is turned on in response to activation of the first control signal. The internal clock generator may be configured to start dividing a buffered clock signal that is output by the clock input buffer in response to activation of a first pulse of the second control signal. Additionally, the memory controller may output the command signal in response to activation of a second pulse of the second control signal.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
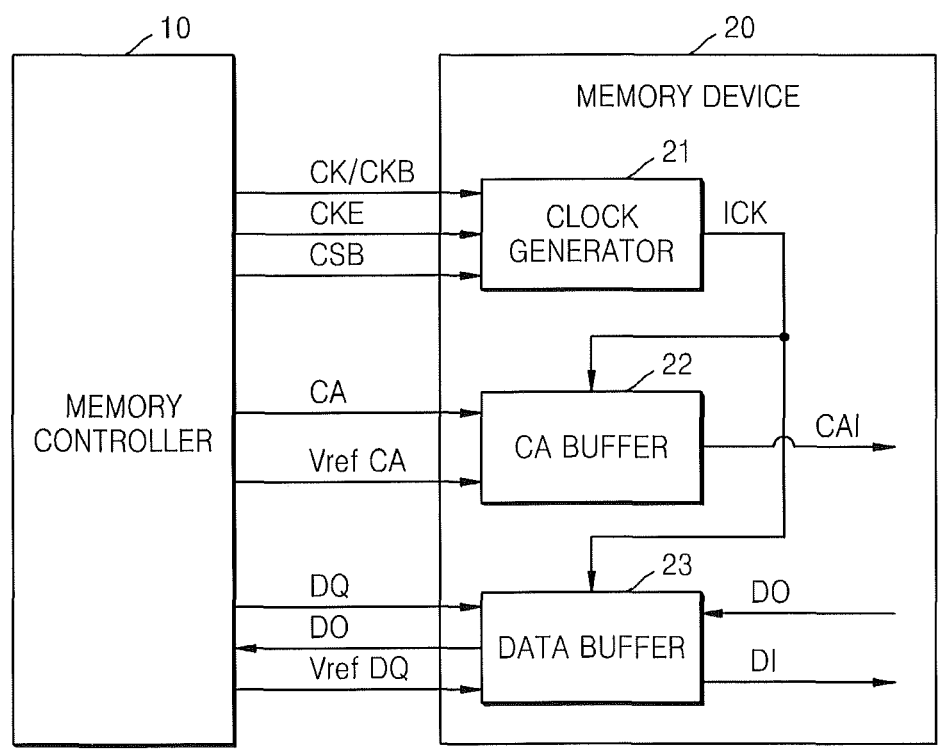
FIG. 1 is a block diagram of a memory system according to an embodiment of the inventive concept.

Hereinafter, the inventive concept will be described more fully with reference to the accompanying drawings, in which example embodiments of the inventive concept are shown. The inventive concept may, however, be embodied in many different forms and should not be construed as limited to the example embodiments set forth herein. Rather, these embodiments are provided so that this disclosure will be thorough and complete, and will fully convey the scope of the inventive concept to those of ordinary skill in the art. Although a few embodiments of the inventive concept have been shown and described, it will be appreciated by those of ordinary skill in the art that changes may be made to these example embodiments without departing from the principles and spirit of the inventive concept, the scope of which is defined by the appended claims and their equivalents. In the drawings, like reference numerals denote like elements.

The terminology used herein is for the purpose of describing particular embodiments only and is not intended to be limiting of the inventive concept. As used herein, the singular forms 'a', 'an', and 'the' are intended to include the plural forms as well, unless the context clearly indicates otherwise. It will be further understood that the terms 'comprises' and/or 'comprising' and 'includes' and/or 'including,' when used in this specification, specify the presence of stated features, integers, steps, operations, elements, and/or components, but do not preclude the presence or addition of one or more other features, integers, steps, operations, elements, components, and/or groups thereof.

It will be understood that, although the terms 'first', 'second', 'third', etc., may be used herein to describe various elements and/or components, these elements and components should not be limited by these terms. These terms are only used to distinguish one element or component from another element or component. Thus, a first element or component discussed below could be termed a second element or component without departing from the teachings of the inventive concept.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term 'and/or' includes any and all combinations of one or more of the associated listed items.

Herein, various components of the disclosed memory devices and systems are referred to as being 'on' or 'off.' A component is referred to as being 'on' if a driving current (or voltage) is supplied to one or more subcomponents thereof in order to allow the component to operate normally. In contrast, a component is referred to as being 'off' if a driving current (or voltage) is not supplied to one or more subcomponents thereof such that the component will not operate in its intended fashion.

FIG. 1 is a block diagram of a memory system 1 according to an embodiment of the inventive concept.

Referring to FIG. 1, the memory system 1 may include a memory controller 10 and a memory device 20.

The memory controller 10 may control the memory device 20 by supplying data and control signals to the memory device 20. Specifically, the memory controller 10 may supply a clock signal/inverted clock signal CK/CKB, a clock enable signal CKE, a chip selection signal CSB, command/address CA signals (which may include command signals CMD and address signals ADD), a reference voltage for the command/address signal Vref CA, data DQ, and a reference voltage for the data Vref DQ to the memory device 20.

According to another embodiment of the inventive concept (not shown), the memory controller 10 may supply a clock signal CK other than the clock signal/inverted clock signal CK/CKB to the memory device 20. According to yet another embodiment of the inventive concept (not shown), the memory controller 10 may not provide the reference voltage for the command/address signal Vref CA and/or the reference voltage for the data Vref DQ to the memory device 20 and, instead, the reference voltage for the command/address signal Vref CA and/or the reference voltage for the data Vref DQ may be generated by the memory device 20 or supplied from another source to the memory device 20.

The memory device 20 may include a clock generator 21, a command/address (CA) buffer 22, and a data buffer 23. Although not shown, the memory device 20 may further include one or more memory cell arrays in which a plurality of memory cells are arranged. These memory cell arrays may be in communications with the clock generator 21, the command/address (CA) buffer 22, and/or the data buffer 23. The clock generator 21 may receive the clock signal/inverted clock signal CK/CKB, the clock enable signal CKE, and the chip selection signal CSB from the memory controller 10 and may generate an internal clock signal ICK.

Figure 2:
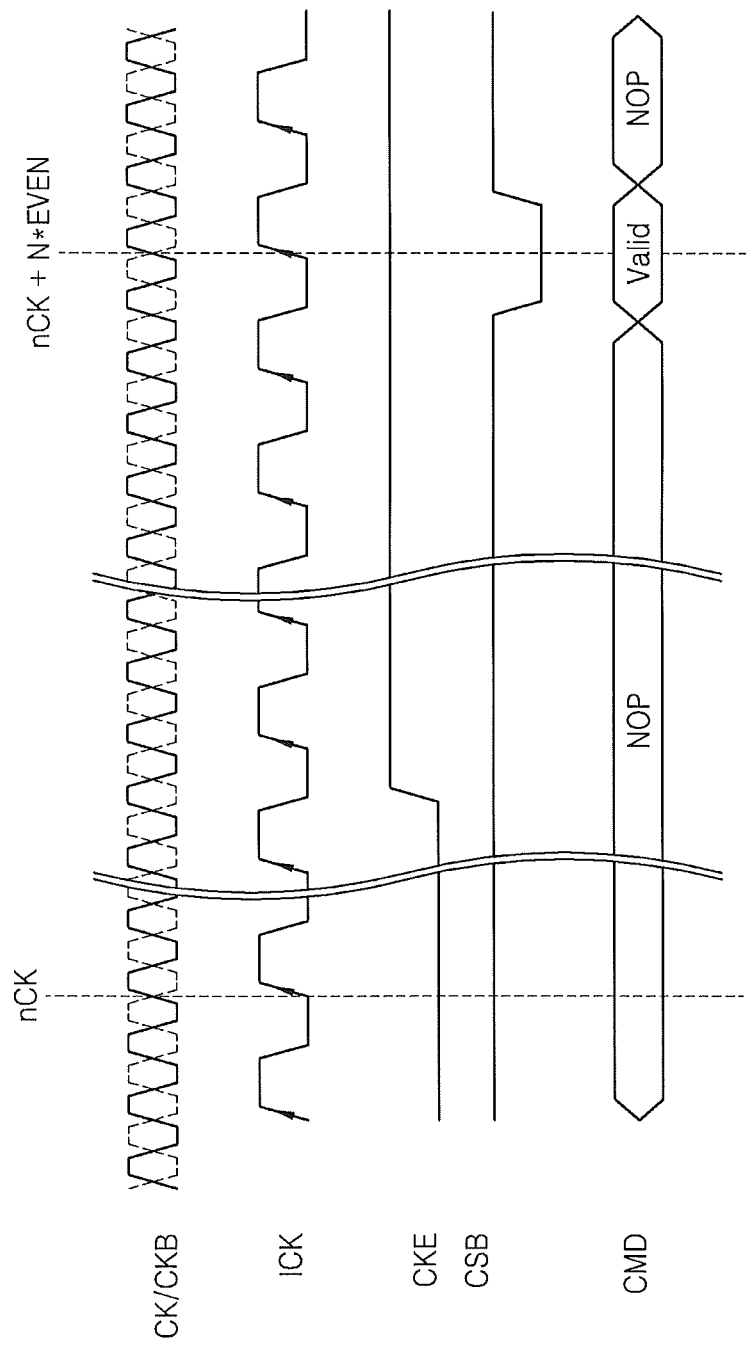
FIG. 2 is a timing diagram illustrating a comparative example of an operation of the memory system of FIG. 1.

FIG. 2 is a timing diagram illustrating a comparative example of an operation of the memory system 1 of FIG. 1.

Referring to FIG. 2, the clock signal/inverted clock signal CK/CKB that is output from the memory controller 10 may be a signal having a first frequency. The internal clock signal ICK output from the clock generator 21 may be a signal having a second frequency that is lower than the first frequency. For example, the second frequency may be half the first frequency.

For example, with recent technology, in the case of a high-speed operation at about 3.2 Gbps, it is difficult to achieve high yield while securing a desired set up/hold margin between a command CMD and a clock signal CK. Thus, the second frequency of the internal clock signal ICK that is generated by the memory device 20 is adjusted to be half the first frequency of the clock signal/inverted clock signal CK/CKB. Such a mode is referred to as a gear down mode. When the gear down mode is used, the second frequency of the internal clock signal ICK is lowered to be half the first frequency of the clock signal/inverted clock signal CK/CKB, and a pulse width of the second clock signal ICK may thus be double the pulse width of the clock signal/inverted clock signal CK/CKB. Thus, the set up/hold margin between the commands CMD and the internal clock signal ICK may be equivalent to that of a 1.6 Gbps memory device when the 3.2 Gbps memory device is operated in gear down mode.

In the gear down mode, the memory controller 10 supplies the clock signal/inverted clock signal CK/CKB, the frequency of which is double that of the internal clock signal ICK, to the memory device 20. When the chip selection signal CSB for the memory device 20 is activated, the controller 10 may also supply a command CMD to the memory device 20, in synchronization with the clock signal/inverted clock signal CK/CKB. However, as shown in FIG. 1, the CA buffer 22 that is included in the memory device 20 operates in synchronization with the internal clock signal ICK.

Thus, the command CMD should be supplied at a rising edge of an even numbered pulse of the clock signal CK (i.e., at nCK+N×EVEN) so that the memory controller 10 may supply the command CMD in synchronization with the internal clock signal ICK. Here, 'n' and 'N' each denote a natural number, and 'EVEN' denotes an even number, e.g., '2'. When this condition is satisfied, the memory controller 10 may supply the command CMD at a rising edge of the internal clock signal ICK, and the CA buffer 22 may receive the command CMD in synchronization with the internal clock signal ICK.

Thus, even in a power-down mode in which the clock enable signal CKE is deactivated and the supply of power to various components of the memory device 20 is cut off, the clock generator 21 may generate the internal clock signal ICK by dividing the clock signal/inverted clock signal CK/CKB.

Referring back to FIG. 1, in the present embodiment, the clock generator 21 may be 'on' or 'off' based on a value of the clock enable signal CKE, and may start to generate the internal clock signal ICK in response to activation of the chip selection signal CSB. In detail, when a first pulse P1 of the chip selection signal CSB (see FIG. 5) is activated, the clock generator 21 may start to generate the internal clock signal ICK. Thus, in the power-down mode, the clock generator 21 may be 'off,' thus reducing the amount of standby current that is consumed by the clock generator 21 in the power-down mode. Operation of the clock generator 21 is described in further detail with reference to FIG. 4 below.

The CA buffer 22 may receive the command/address CA signal and the reference voltage for the command/address signal Vref CA from the memory controller 10, and may output an internal command/address signal CAI in response thereto. The CA buffer 22 may operate in synchronization with the internal clock signal ICK, and may be 'on' or 'off' according to the internal clock signal ICK. Thus, since when the memory system 1 is in the power-down mode the internal clock signal ICK is not generated, the CA buffer 22 may also be 'off' in the power-down mode, thus reducing the amount of standby current consumed by the CA buffer 22.

The data buffer 23 may receive the data DQ and the reference voltage for the data Vref DQ from the memory controller 10 and may output internal data DI in response thereto. The data buffer 23 may also receive data DO that is read from the memory device 20 and then output the data DO to the memory controller 10. The data buffer 23 may operate in synchronization with the internal clock signal ICK and may be 'on' or 'off' according to the internal clock signal ICK. Thus, since when the memory system 1 is in the power-down mode the internal clock signal ICK is not generated, the data buffer 23 may also be 'off' in the power-down mode, thus reducing the amount of standby current consumed by the data buffer 23.

Figure 3:
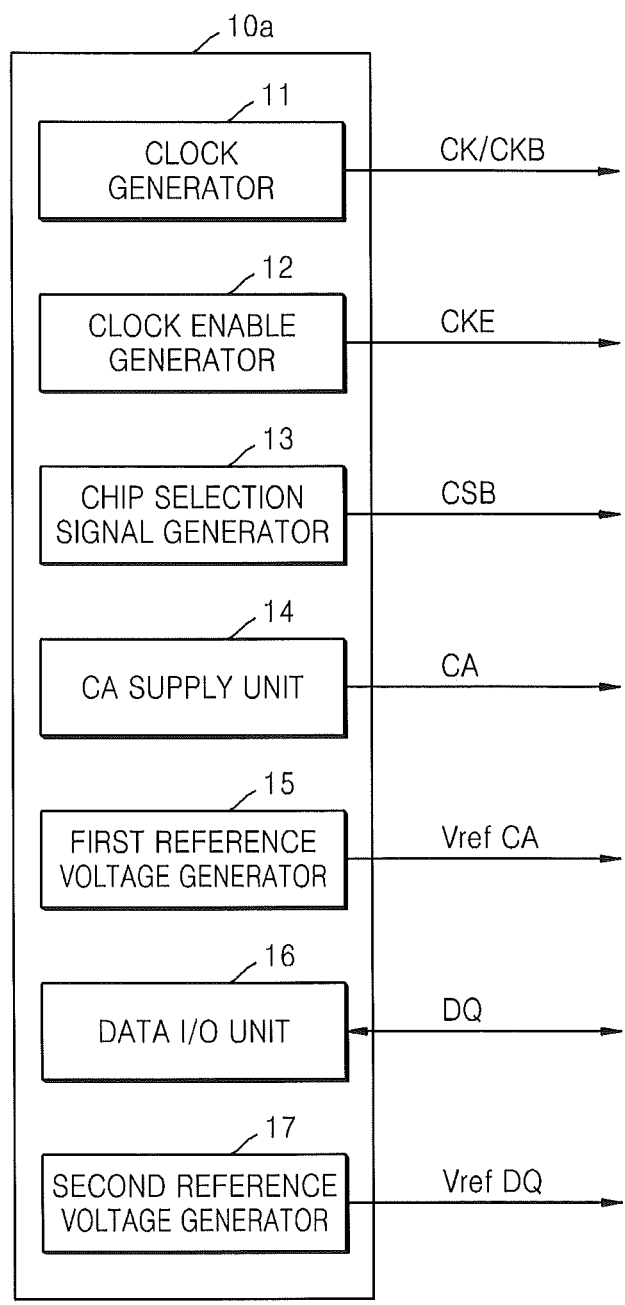
FIG. 3 is a block diagram of a memory controller that is included in the memory system of FIG. 1, according to an embodiment of the inventive concept.

FIG. 3 is a block diagram of a memory controller 10a that is included in the memory system of FIG. 1, according to embodiments of the inventive concept.

Referring to FIG. 3, the memory controller 10a may include a clock generator 11, a clock enable signal generator 12, a chip selection signal generator 13, a command/address (CA) supply unit 14, a first reference voltage generator 15, a data input/output (I/O) unit 16, and a second reference voltage generator 17.

In a normal operating mode, the clock generator 11 may generate a clock signal/inverted clock signal CK/CKB having a first frequency and may supply the clock signal/inverted clock signal CK/CKB to the clock generator 21 included in the memory device 20 of FIG. 1. A command/address signal CA that is output from the CA supply unit 14, and data DQ that is output from the data I/O unit 16 may be supplied to the memory device 20 in synchronization with the clock signal/inverted clock signal CK/CKB. According to another embodiment of the inventive concept, the clock generator 11 may generate only the clock signal CK and supply the clock signal CK to the clock generator 21. In this embodiment, the command/address signal CA that is output from the CA supply unit 14 and the data DQ that is output from the data I/O unit 16 may be supplied to the memory device 20 in synchronization with the clock signal CK.

The clock enable signal generator 12 may generate a clock enable signal CKE and may supply the clock enable signal CKE to the clock generator 21 that is included in the memory device 20. The clock enable signal CKE may be used to command the memory device 20 to enter the power-down mode and/or to exit the power-down mode to return to a normal operating mode. For example, in one embodiment, when the clock enable signal CKE is deactivated, the memory device 20 may be configured to enter the power-down mode, and when the clock enable signal CKE is activated, the memory device 20 may be configured so that it will exit the power-down mode and return to the normal operating mode.

The chip selection signal generator 13 may generate a chip selection signal CSB and supply the chip selection signal CSB to the clock generator 21 that is included in the memory device 20. In some embodiments, the chip selection signal CSB may indicate a selection operation that is related to the memory device 20, as will be discussed in greater detail below. In some embodiments, the chip selection signal CSB may include a first pulse P1 and a second pulse P2 that is subsequent to the first pulse P1 (see FIG. 5).

In some embodiments, when the first pulse P1 is activated, the memory device 20 may start to generate the internal clock signal ICK. Thus, the first pulse P1 of the chip selection signal CSB may be used as a trigger signal to trigger generation of the internal clock signal ICK. When the second pulse P2 is activated, the memory device 20 may receive the command/address signal CA. Thus, the second pulse P2 of the chip selection signal CSB may be used as a trigger signal to trigger receipt of the command/address signal CA.

The CA supply unit 14 may supply the command/address signal CA to the CA buffer 22 that is included in the memory device 20. The first reference voltage generator 15 may generate a first reference voltage Vref CA that is a reference voltage for the command/address signal CA and may supply the first reference voltage Vref CA to the CA buffer 22 that is included in the memory device 20.

The data I/O unit 16 may supply data DQ to the data buffer 23 that is included in the memory device 20 or receive data DO from the data buffer 23. The second reference voltage generator 17 may generate a second reference voltage Vref DQ that is a reference voltage for the data DQ and DO, and may supply this second reference voltage Vref DQ to the data buffer 23.

Figure 4:
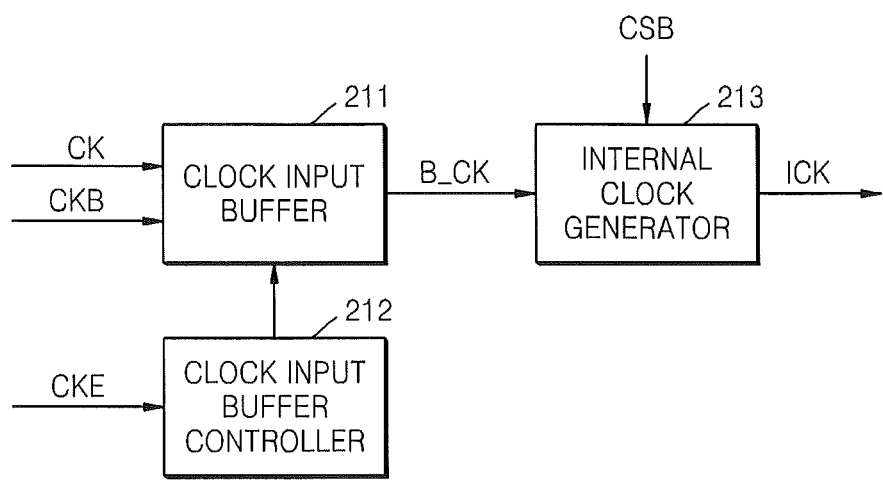
FIG. 4 is a block diagram of a clock generator that is included in the memory system of FIG. 1, according to an embodiment of the inventive concept.

FIG. 4 is a block diagram of a clock generator 21A that is an embodiment of the clock generator 21 illustrated in FIG. 1, according to embodiments of the inventive concept.

Referring to FIG. 4, the clock generator 21A may include a clock input buffer 211, a clock input buffer controller 212, and an internal clock generator 213.

The clock input buffer 211 may generate a buffered clock signal B_CK by buffering a clock signal/inverted clock signal CK/CKB that is received from the memory controller 10. The clock input buffer 211 may be 'on' or 'off' based on a clock enable signal CKE that is received from the memory controller 10. According to another embodiment of the inventive concept, the clock input buffer 211 may receive only the clock signal CK from the memory controller 10, and may generate the buffered clock signal B_CK by buffering the clock signal CK.

The clock input buffer controller 212 may control the clock input buffer 211 to be 'on' or 'off' based on the values of the clock enable signal CKE that is received from the memory controller 10. For example, when the clock enable signal CKE is activated, the clock input buffer controller 212 may control the clock input buffer 211 to be 'on'. When the clock enable signal CKE is deactivated, the clock input buffer controller 212 may control the clock input buffer 211 to be 'off'. Thus, in the power-down mode in which the clock enable signal CKE is deactivated, the clock input buffer 211 does not operate, thus reducing the amount of standby current consumed.

The internal clock generator 213 may generate an internal clock signal ICK by dividing the buffered clock signal B_CK. The division of the buffered clock signal B_CK by the internal clock generator 213 may be performed based on the value of the chip selection signal CSB. Specifically, when a first pulse P1 of the chip selection signal CSB is received by the internal clock generator 213, the internal clock generator 213 may generate the internal clock signal ICK from the buffered clock signal B_CK by dividing the buffered clock signal B_CK.

More specifically, when the clock enable signal CKE is activated and the first pulse P1 of the chip selection signal CSB is input to the internal clock generator 213, the internal clock generator 213 may generate the internal clock signal ICK from the buffered clock signal B_CK by starting a division of the buffered clock signal B_CK. In contrast, in the power-down mode, the clock enable signal CKE is deactivated such that the internal clock generator 213 does not operate, thus reducing the amount of standby current consumed.

In the present embodiment, the internal clock generator 213 may generate the internal clock signal ICK having a second frequency by dividing a first frequency of the buffered clock signal B_CK in half. However, the inventive concept is not limited thereto, and the internal clock generator 213 may generate the internal clock signal ICK having the second frequency by dividing the first frequency of the buffered clock signal B_CK by 1/N, where denotes a natural number.

Figure 5:
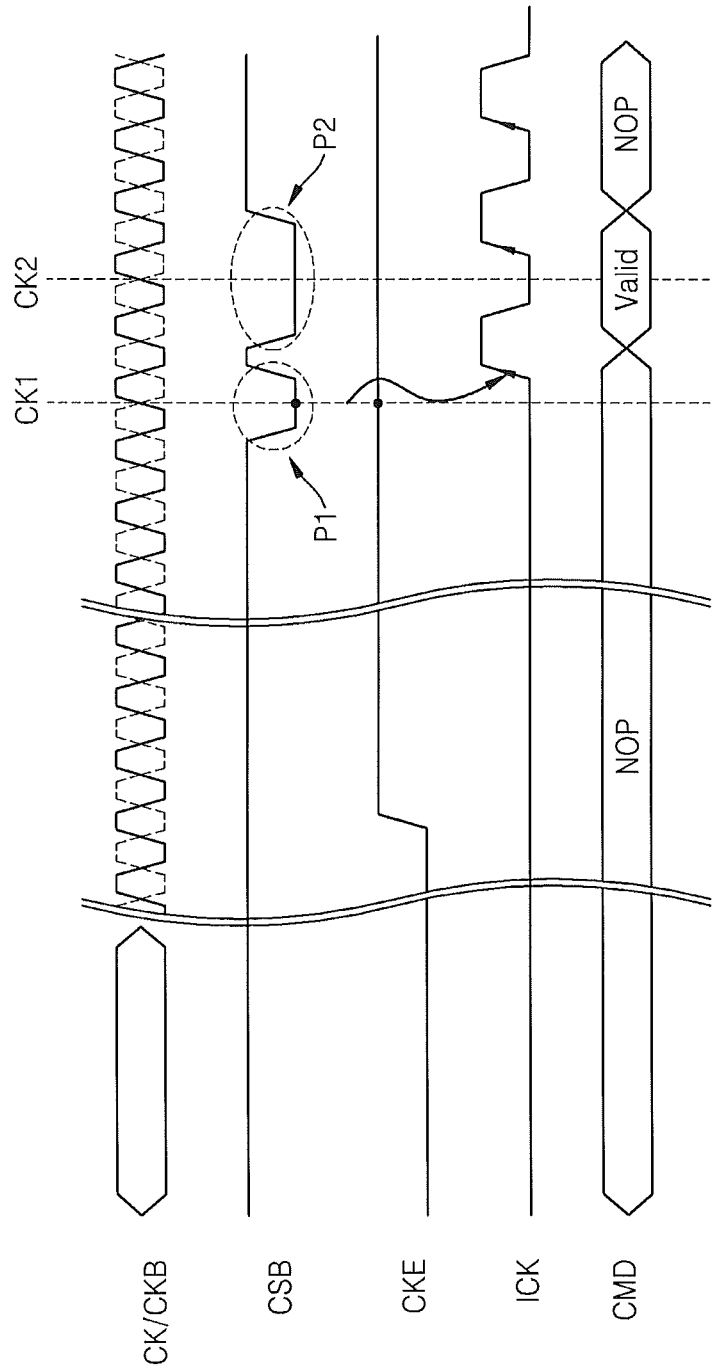
FIG. 5 is a timing diagram illustrating operation of a memory system having a memory device that includes the memory controller of FIG. 3 and the clock generator of FIG. 4, according to an embodiment of the inventive concept.

FIG. 5 is a timing diagram illustrating operation of a memory system having a memory device that includes the memory controller 10a of FIG. 3 and the clock generator 21A of FIG. 4, according to an embodiment of the inventive concept.

Referring to FIG. 5, in the power-down mode in which the clock enable signal CKE is deactivated, for example, to be logic low, the clock input buffer 211 and the internal clock generator 213 of FIG. 1 may be 'off' and an internal clock signal ICK may thus not be generated. Thus, in the power-down mode, the amount of standby current for generating the internal clock signal ICK may be reduced.

When the clock enable signal CKE is activated, for example, to be logic high, and the power-down mode is exited, the clock input buffer 211 and the internal clock generator 213 may thus be 'on'. Thus, the clock input buffer 211 may buffer a clock signal/inverted clock signal CK/CKB.

As shown in FIG. 5, if the clock enable signal CKE is activated and a first pulse P1 of the chip selection signal CSB is activated, e.g., when the clock enable signal CKE is logic high and the first pulse P1 of the chip selection signal CSB is logic low, then the internal clock generator 213 may generate the internal clock signal ICK from a buffered clock signal B_CK by starting a division of the buffered clock signal B_CK. As described above, the first pulse P1 of the chip selection signal CSB may be used as a trigger signal for the internal clock generator 213 to start dividing the buffered clock signal B_CK.

If the clock enable signal CKE is activated and a second pulse P2 of the chip selection signal CSB is activated, e.g., when the clock enable signal CKE is logic high and the second pulse P2 of the chip selection signal CSB is logic low, then the CA supply unit 14 may supply a command CMD to the CA buffer 21. In this case, the second pulse P2 of the chip selection signal CSB may be activated an even number of clock cycles after the cycle of the clock signal/inverted clock signal CK/CKB at which the first pulse P1 is activated.

Specifically, the second pulse P2 of the chip selection signal CSB may be activated at a second clock cycle CK2 which is an even number of clock cycles after a first clock CK1 of the clock signal CK that corresponds to a point of time when the first pulse P1 occurs. In this case, when the first clock cycle CK1 is nCK, the second clock cycle CK2 may be (nCK+N× EVEN), where 'n' and 'N' may each denote a natural number. As described above, when the second pulse P2 of the chip selection signal CSB is activated, the CA buffer 21 may receive the command CMD in synchronization with the internal clock signal ICK.

In the current embodiment, when the first pulse P1 of the chip selection signal CSB occurs, the internal clock generator 213 may start to generate the internal clock signal ICK. When the second pulse P2 of the chip selection signal CSB occurs, the CA supply unit 14 may supply the command CMD in synchronization with the second clock CK2 of the clock signal CK. Thus, the CA buffer 22 may receive the command CMD in synchronization with the internal clock signal ICK.

Thus, when the power-down mode is entered, the clock input buffer 211 and the internal clock generator 213 are 'off', and when the power-down mode is exited, the CA buffer 22 may receive the command CMD in synchronization with the internal clock signal ICK. Accordingly, the memory device 20 may stably operate in the gear down mode.

Figure 6:
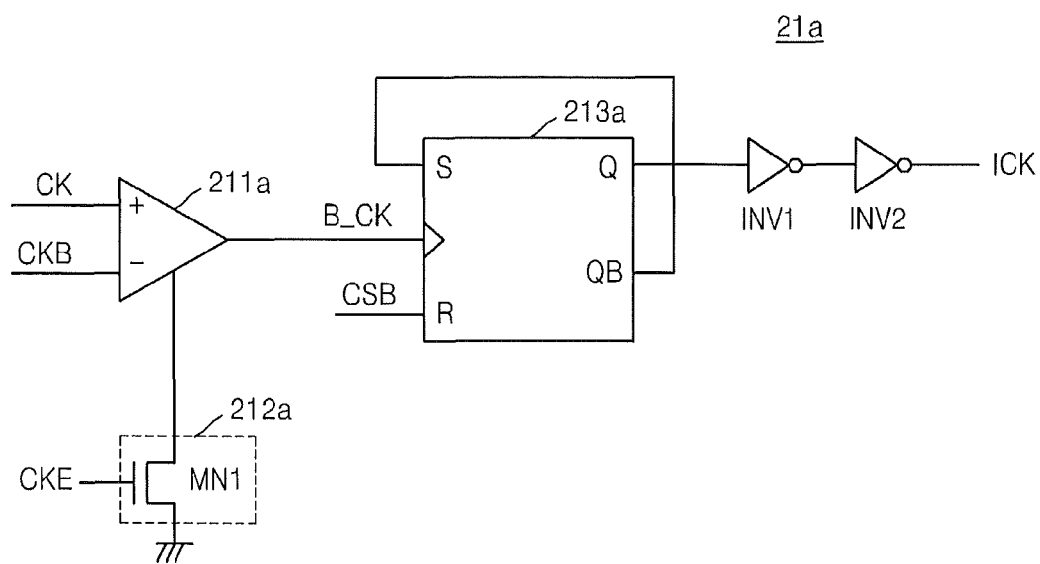
FIG. 6 is a circuit diagram of an implementation of the clock generator of FIG. 4, according to an embodiment of the inventive concept.

FIG. 6 is a circuit diagram of a clock generator 21a that is one possible implementation of the clock generator 21A of FIG. 4 according to certain embodiments of the inventive concept.

Referring to FIG. 6, the clock generator 21a may include a clock input buffer 211a, a clock input buffer controller 212a, and an internal clock generator 213a. The clock generator 21a may further include first and second inverters INV1 and INV2.

The clock input buffer 211a may receive a clock signal CK via a first input terminal thereof, receive an inverted clock signal CKB via a second input terminal thereof, and output a buffered clock signal B_CK, based on differential signaling. In this case, the clock input buffer 211a may be 'on' or 'off' under control of the clock input buffer controller 212a.

The clock input buffer controller 212a may include a first NMOS transistor MN 1 having a gate that receives the clock enable signal CKE, a drain that is connected to the clock input buffer 211a, and a source that is connected to a ground terminal (or other reference voltage). The clock input buffer controller 212a may act as a current source for the clock input buffer 211a.

Specifically, when the clock enable signal CKE is logic high, then the first NMOS transistor MN1 is turned on. Thus, since the first NMOS transistor MN1 supplies driving current to the clock input buffer 211a, the clock input buffer 211a is turned on. In contrast, when the clock enable signal CKE is logic low, then the first NMOS transistor MN1 is turned off. Thus, since the first NMOS transistor MN1 does not supply the driving current to the clock input buffer 211a, the clock input buffer 211a is turned 'off'.

The internal clock generator 213a may be embodied as a flip flop in which an output signal of an inverted output terminal QB is received via a set terminal S, a chip selection signal CSB is received via a reset terminal R, and a buffered clock signal B_CK is received via a clock terminal. The internal clock generator 213a may generate an internal clock signal ICK by dividing the buffered clock signal B_CK. According to another embodiment of the inventive concept, a control signal that is enabled when a first pulse P1 of the chip selection signal CSB is input may be received via the reset terminal R. It will likewise be appreciated that other circuits may be used to generate the internal clock signal ICK.

Figure 7:
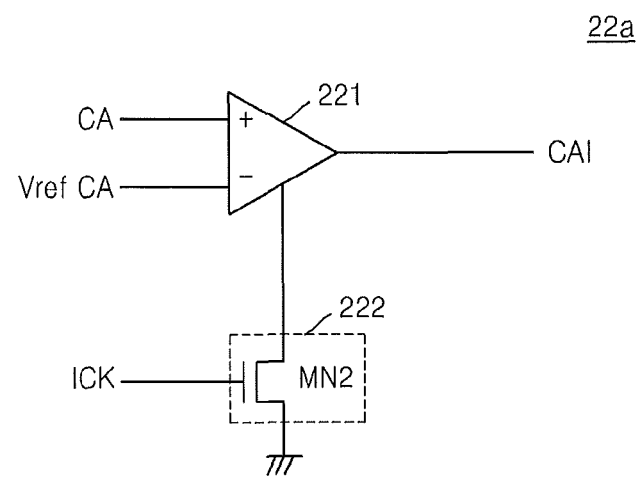
FIG. 7 is a circuit diagram of an implementation of the command/address (CA) buffer that is illustrated in FIG. 1, according to an embodiment of the inventive concept.

FIG. 7 is a circuit diagram of one possible implementation of the CA buffer 22 illustrated in FIG. 1, according to certain embodiments of the inventive concept.

Referring to FIG. 7, the CA buffer 22a may include an input buffer 221 and a controller 222.

The input buffer 221 may receive a command/address signal CA from the memory controller 10 of FIG. 1 via a first input terminal, receive a reference voltage for the command/address signal Vref CA from the memory controller 10 via a second input terminal, and output an internal command/address signal CAI, based on differential signaling. According to another embodiment of the inventive concept, the reference voltage for the command/address signal Vref CA may be a reference voltage generated by a reference voltage generator (not shown) included in the memory device 20 or that is supplied to the memory device 20 from another source.

The controller 222 may include a second NMOS transistor MN2 having a gate which receives the internal clock signal ICK, a drain that is connected to the input buffer 221, and a source that is connected to a ground terminal (or other reference voltage). As described above, the controller 222 may be embodied in the form of a current source. Thus, when in the power-down mode, the internal clock signal ICK is not supplied to the controller 222, and the input buffer 221 is 'off'. When the internal clock signal ICK is supplied to the controller 222, the input buffer 221 is turned 'on' and may output the internal command/address signal CAI in synchronization with the internal clock signal ICK.

Figure 8:
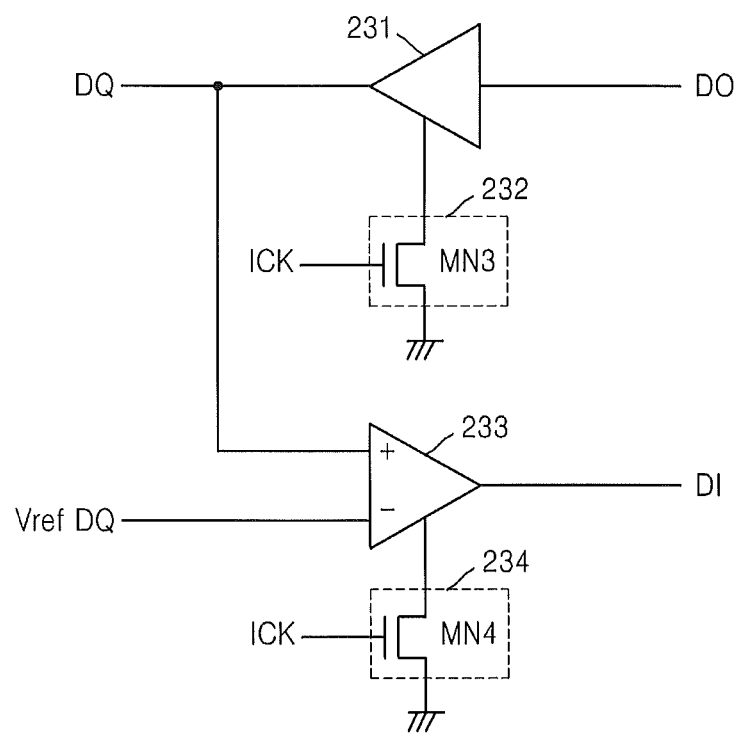
FIG. 8 is a circuit diagram of an implementation of the data buffer that is illustrated in FIG. 1, according to an embodiment of the inventive concept.

FIG. 8 is a circuit diagram of an implementation of the data buffer 23 that is illustrated in FIG. 1, according to certain embodiments of the inventive concept.

Referring to FIG. 8, the data buffer 23a may include an output buffer 231, a first controller 232, an input buffer 233, and a second controller 234.

The output buffer 231 may buffer data DO that is read from the memory device 20 of FIG. 1 and supply the buffered data DO to the memory controller 10. An output terminal of the output buffer 231 may be connected to a first input terminal of the input buffer 233.

The first controller 232 may include a third NMOS transistor MN3 having a gate that receives the internal clock signal ICK, a drain that is connected to the output buffer 231, and a source that is connected to a ground terminal (or other reference voltage). The first controller 232 may act as a current source for the output buffer 231. Specifically, when in the power-down mode, the internal clock signal ICK is not supplied to the output buffer 231, and the output buffer 231 is 'off'. In contrast, when the internal clock signal ICK is supplied to the output buffer 231 after the device exits the power-down mode, the output buffer 231 is turned 'on'

The input buffer 233 may receive data DQ from the memory controller 10 of FIG. 1 via its first input terminal, receive a reference voltage for the data Vref DQ from the memory controller 10 via a second input terminal, and output internal data DI, based on differential signaling. According to another embodiment of the inventive concept, the reference voltage for the data Vref DQ may be a reference voltage that is generated by the reference voltage generator included in the memory device 20 or that is supplied to the memory device 20 from another source.

The second controller 234 may include a fourth NMOS transistor MN4 having a gate which receives the internal clock signal ICK, a drain that is connected to the input buffer 233, and a source that is connected to the ground terminal (or other reference voltage). The second controller 234 may act as a current source for the input buffer 233. Specifically, when in the power-down mode, the internal clock signal ICK is not supplied to the input buffer 233, the input buffer 233 is 'off'. In contrast, when the internal clock signal ICK is supplied to the input buffer 233, the input buffer 233 is turned 'on' and may output the internal data DI in synchronization with the internal clock signal ICK.

Figure 9:
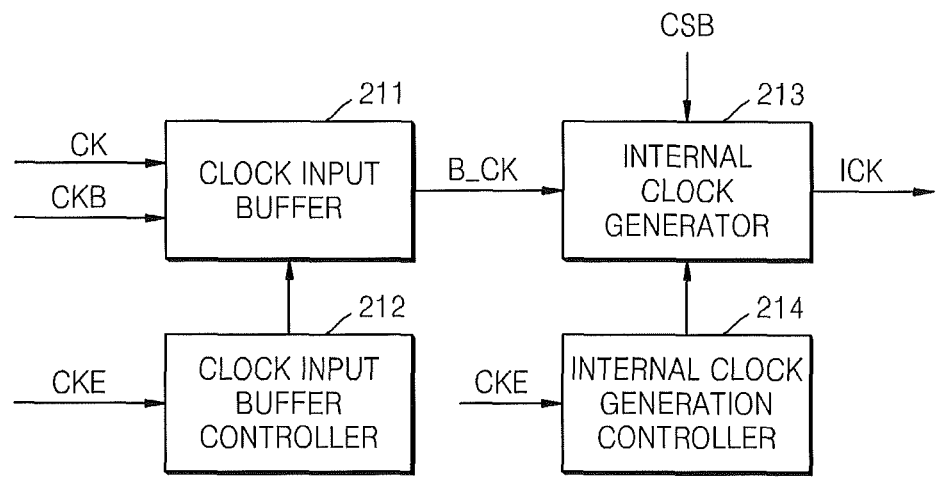
FIG. 9 is a block diagram of the clock generator that is included in the memory system of FIG. 1, according to another embodiment of the inventive concept.

FIG. 9 is a block diagram of a clock generator 21B that is another embodiment of the clock generator 21 illustrated in FIG. 1, according to the inventive concept.

Referring to FIG. 9, the clock generator 21B may include a clock input buffer 211, a clock input buffer controller 212, an internal clock generator 213, and an internal clock generation controller 214. In the embodiment of FIG. 9, some elements of the clock generator 21B are substantially the same as those included in the clock generator 21A of FIG. 4. The same elements are denoted by the same reference numerals and are not described again here. The clock generator 21B is described below with respect to the differences from the clock generator 21A of FIG. 4.

The internal clock generation controller 214 may control the internal clock generator 213 to be 'on' or 'off' according to the clock enable signal CKE received from the memory controller 10 of FIG. 1. For example, when the clock enable signal CKE is activated, the internal clock generation controller 214 may control the internal clock generator 213 to be 'on'. When the clock enable signal CKE is deactivated, the internal clock generation controller 214 may control the internal clock generator 213 to be 'off'. Thus, in the power-down mode in which the clock enable signal CKE is deactivated, the internal clock generator 213 does not operate, thus reducing the amount of standby current consumed.

Figure 10:
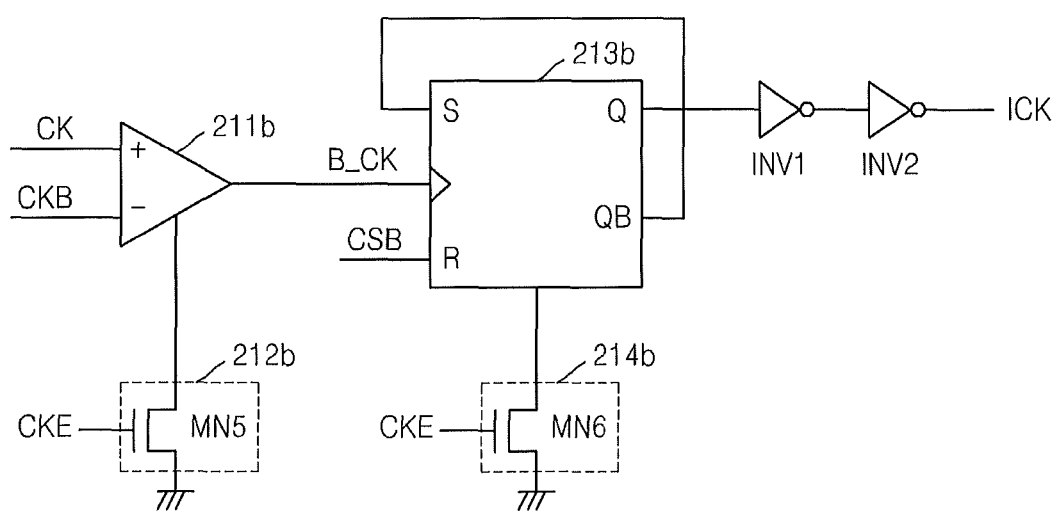
FIG. 10 is a circuit diagram of the clock generator of FIG. 9, according to another embodiment of the inventive concept.

FIG. 10 is a circuit diagram of a clock generator 21b that is one possible implementation of the clock generator 21B of FIG. 9 according to another embodiment of the inventive concept.

Referring to FIG. 10, the clock generator 21b may include a clock input buffer 211b, a clock input buffer controller 212b, an internal clock generator 213b, and an internal clock generation controller 214b. The clock generator 21b may further include first and second inverters INV1 and INV2.

The clock input buffer 211b may receive a clock signal CK via a first input terminal, receive an inverted clock signal CKB via a second input terminal, and output a buffered clock signal B_CK, based on differential signaling. The clock input buffer 211b may be 'on' or 'off' under control of the clock input buffer controller 212b.

The clock input buffer controller 212b may include a fifth NMOS transistor MN5 having a gate which receives the clock enable signal CKE, a drain that is connected to the clock input buffer 211b, and a source that is connected to a ground terminal (or other reference voltage). As described above, the clock input buffer controller 212b may act as a current source for the clock input buffer 211b.

The internal clock generator 213b may be embodied as a flip flop that receives an output signal of an inverted output terminal QB via a set terminal S, receives a chip selection signal CSB via a reset terminal RS, and receives a buffered clock signal B_CK via a clock terminal. The internal clock generator 213b may generate an internal clock signal ICK by dividing the buffered clock signal B_CK.

The internal clock generation controller 214b may include a sixth NMOS transistor MN6 having a gate which receives the clock enable signal CKE, a drain that is connected to the internal clock generator 213b, and a source that is connected to the ground terminal (or other reference voltage). As described above, the internal clock generation controller 214b may act as a current source for the internal clock generator 213b.

Specifically, when the clock enable signal CKE is logic high, the sixth NMOS transistor MN6 is turned on. Thus, the sixth NMOS transistor MN6 supplies driving current to the internal clock generator 213b and the internal clock generator 213b is 'on'. When the clock enable signal CKE is logic low, the sixth NMOS transistor MN6 is turned off, and the sixth NMOS transistor MN6 does not supply the driving current to the internal clock generator 213b and the internal clock generator 213b is 'off'.

Figure 11:
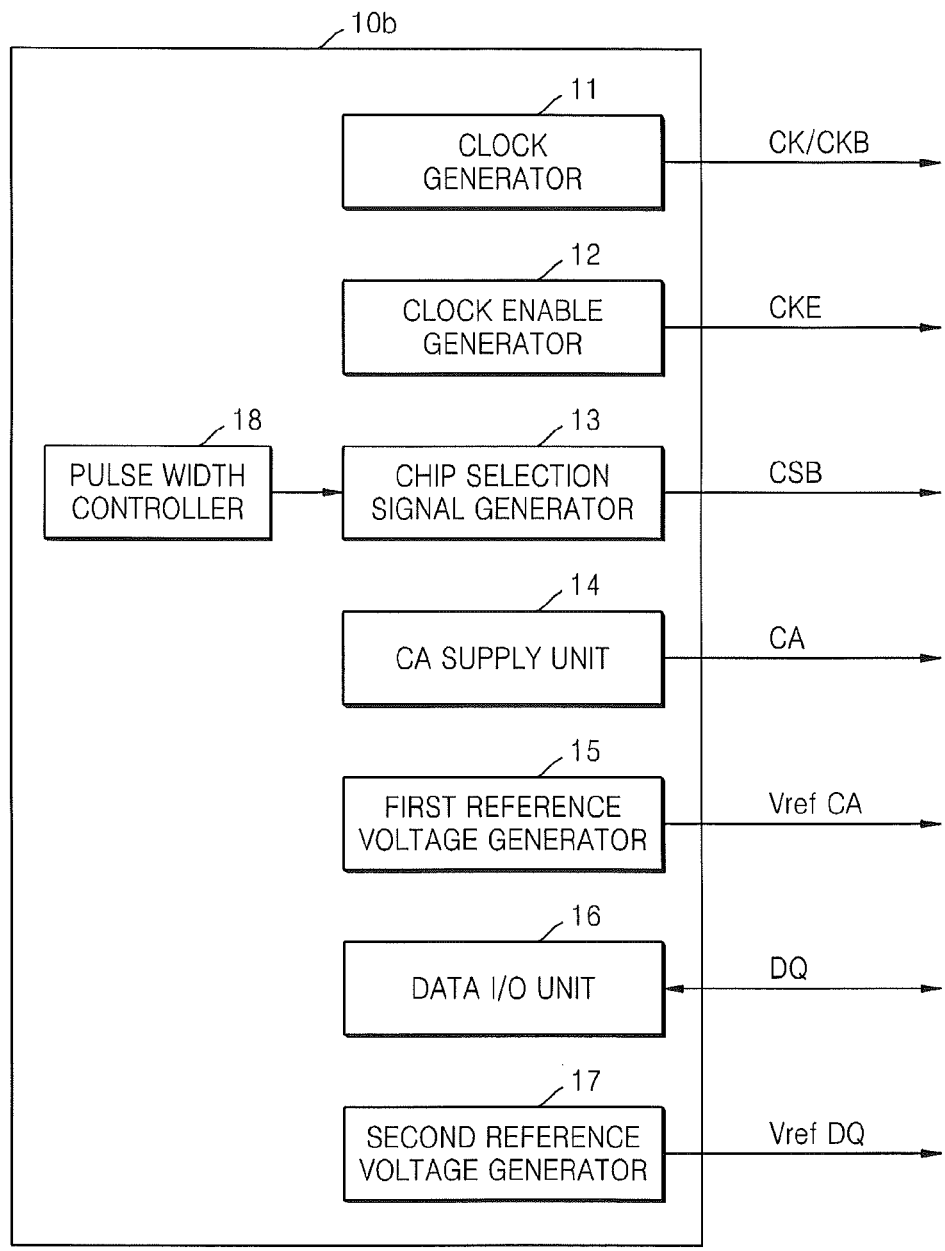
FIG. 11 is a block diagram of the memory controller that is included in the memory system of FIG. 1, according to another embodiment of the inventive concept.

FIG. 11 is a block diagram of a memory controller 10b that is another embodiment of the memory controller 10 illustrated in FIG. 1, according to the inventive concept.

Referring to FIG. 11, the memory controller 10b may include a clock generator 11, a clock enable generator 12, a chip selection signal generator 13, a CA supply unit 14, a first reference voltage generator 15, a data I/O unit 16, a second reference voltage generator 17, and a pulse width controller 18. In the embodiment of FIG. 11, some elements of the memory controller 10b are substantially the same as those of the memory controller 10a of FIG. 3. The same elements are denoted by the same reference numerals and are not described again here. The memory controller 10b is described below with respect to the differences from the memory controller 10a of FIG. 3.

Figure 12:
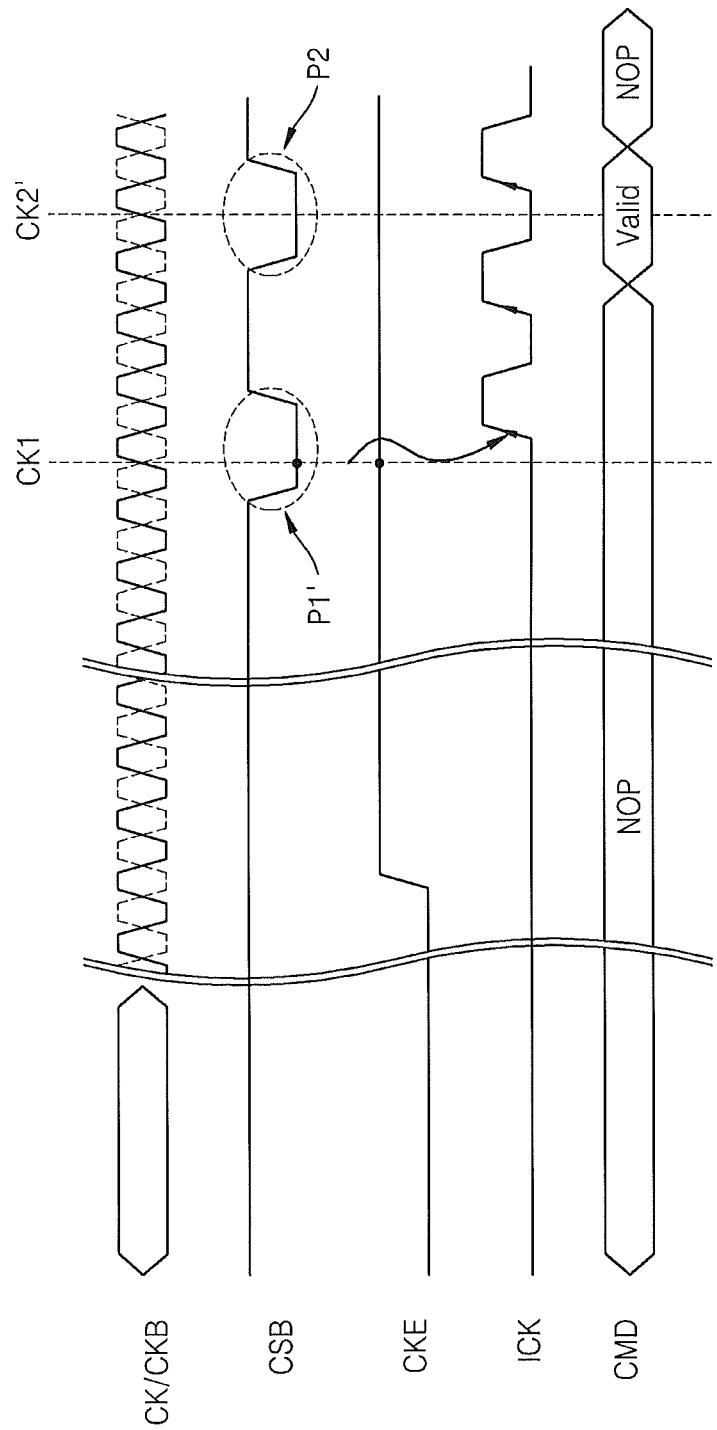
FIG. 12 is a timing diagram illustrating an operation of the memory system including the memory controller of FIG. 11, according to another embodiment of the inventive concept.

FIG. 12 is a timing diagram illustrating operation of an embodiment of the memory system 1 that includes the memory controller 10b of FIG. 11, according to another embodiment of the inventive concept.

Referring to FIGS. 11 and 12, when a first pulse P1' of a chip selection signal CSB has a width that is narrower than a width of another pulse of the chip selection signal CSB, inter symbol interference (ISI) may occur. For example, assume that the chip selection signal CSB has logic levels '1', '1', '0' '1', and '1', where the logic level '1' corresponds to 5 V and the logic level '0' corresponds to 0 V. In this example, the voltage in a period having the logic level '0' may not be lowered to 0 V due to preceding and subsequent periods thereof having the logic level '1'. This phenomenon may be referred to as duty error amplification.

The pulse width controller 18 may control the pulse width of the first pulse P1' of the chip selection signal CSB so that the pulse width of the first pulse P1' of the chip selection signal CSB may be greater than one clock cycle of a clock signal/inverted clock signal CK/CKB. Specifically, the pulse width controller 18 may control the pulse width of the first pulse P1' of the chip selection signal CSB by dividing the chip selection signal CSB.

According to an embodiment of the inventive concept, the pulse width controller 18 may control the pulse width of the first pulse P1' of the chip selection signal CSB to be twice as large as normal. In other words, the pulse width controller 18 may control the pulse width of the first pulse P1' of the chip selection signal CSB so that the pulse width of the first pulse P1' of the chip selection signal CSB may correspond to two clock cycles of the clock signal CK. Thus, in the example set forth above, the chip selection signal CSB may have logic levels '1', '1', '0', '0', '1', and '1'. In this case, a period having the logic level '0' may be sufficiently secured.

As described above, the pulse width of the first pulse P1' of the chip selection signal CSB is controlled to be greater than one clock cycle of the clock signal CK, and thus, a period in which the first pulse P1' is maintained may include a rising edge of the clock signal CK even when an error occurs due to a change in the clock signal CK. Thus, the clock generator 21 may stably generate the internal clock signal ICK at a rising edge of the clock signal CK. Thus, the memory device 20 may operate more stably and the signal integrity of the memory device 20 may be improved.

According to another embodiment of the inventive concept, the pulse width controller 18 may control the pulse width of the first pulse P1' of the chip selection signal CSB to be increased by four times or by eight times. In other words, the pulse width controller 18 may control the pulse width of the first pulse P1' of the chip selection signal CSB to correspond to four or eight clock cycles of the clock signal CK. Thus, in the example set forth above, the chip selection signal CSB may have logic levels '1', '1', '0', '0', '0', '0', '1', and '1' or logic levels '1', '1', '0', '0', '0', '0', '0', '0', '0', '0', '1', and '1'. In these cases, since periods having the logic level '0' may be more sufficiently secured, the memory device 20 may operate more stably and the signal integrity of the memory device 20 may be improved.

In the power-down mode in which the clock enable signal CKE is deactivated, for example, to be logic low, the clock input buffer 21 and the internal clock generator 213 may be 'off' and the internal clock signal ICK may thus not be generated. Thus, in the power-down mode, it is possible to reduce the amount of standby current that is consumed.

When the clock enable signal CKE is activated, for example, to be logic high, and the power-down mode is exited, the clock input buffer 21 and the internal clock generator 213 may be turned 'on', and the clock input buffer 21 may start to buffer the clock signal/inverted clock signal CK/CKB.

When the clock enable signal CKE is activated and the first pulse P1' of the chip selection signal CSB is deactivated, for example, when the clock enable signal CKE is logic high and the first pulse P1' of the chip selection signal CSB is logic low, then the internal clock generator 213 starts to divide the buffered clock signal B_CK so as to generate the internal clock signal ICK from the buffered clock signal B_CK. As described above, the first pulse P1' of the chip selection signal CSB may be used as a trigger signal for the internal clock generator 213 to start dividing the buffered clock signal B_CK.

When the clock enable signal CKE is activated and a second pulse P2 of the chip selection signal CSB is deactivated, for example, when the clock enable signal CKE is logic high and the first pulse P1' of the chip selection signal CSB is logic low, then the CA supply unit 14 may provide a command CMD to the CA buffer 21. As discussed above, the second pulse P2 of the chip selection signal CSB may be activated to on a clock cycle that is an even number of clock cycles of the clock signal/inverted clock signal CK/CKB after activation of the first pulse P1'.

Specifically, the second pulse P2 of the chip selection signal CSB may be activated on a second clock CK2' that is an even number of clock cycles after a first clock cycle CK1 of the clock signal CK, where the first clock cycle CK1 corresponds to the point in time when the first pulse P1 occurs. Thus, if the first clock CK1 occurs at nCK, the second clock CK2' may occur at (nCK+N×EVEN), where 'n' and 'N' each denote a natural number, and 'EVEN' may be an even number, e.g., '2'. As described above, when the second pulse P2 of the chip selection signal CSB is activated, the CA buffer 21 may receive a command CMD in synchronization with the internal clock signal ICK.

In the embodiment of FIGS. 11 and 12, when the first pulse P1' of the chip selection signal CSB occurs, the internal clock generator 213 may start to generate the internal clock signal ICK. When the second pulse P2 of the chip selection signal CSB occurs, the CA supply unit 14 may provide the command CMD, in synchronization with the second clock CK2' of the clock signal CK. Thus, the CA buffer 22 may receive the command CMD in synchronization with the internal clock signal ICK.

Thus, when the power-down mode is entered, the clock input buffer 211 and the internal clock generator 213 may be 'off' and when the power-down mode is exited, the CA buffer 22 may receive the command CMD in synchronization with the internal clock signal ICK. Thus, the memory device 20 may stably operate in the gear down mode.

Figure 13:
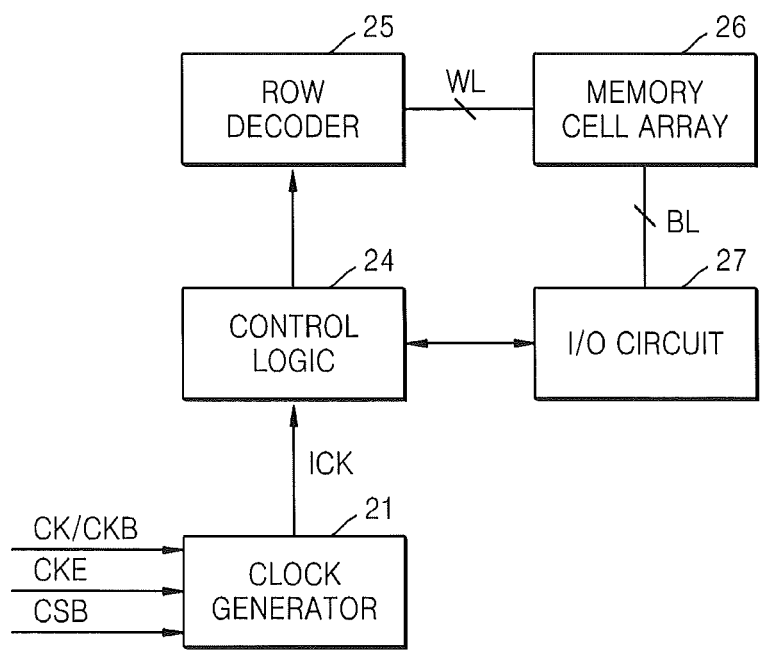
FIG. 13 is a block diagram of the memory device that is included in the memory system of FIG. 1, according to an embodiment of the inventive concept.

FIG. 13 is a block diagram of a memory device 20A that is another embodiment of the memory device 20 illustrated in FIG. 1, according to an embodiment of the inventive concept.

Referring to FIG. 13, the memory device 20A may include a clock generator 21, a control logic 24, a row decoder 25, a memory cell array 26, and an I/O circuit 27.

The clock generator 21 may be embodied according to any of the embodiments described above, and is not described again here. The control logic 24 may communicate with the row decoder 25 and the I/O circuit 27. The control logic 24 may include the CA buffer 22 and the data buffer 23 of FIG. 1.

The row decoder 25 may communicate with the memory cell array 26 via a plurality of word lines WL. The memory cell array 26 may include a plurality of memory cells (not shown). Although not shown, the I/O circuit 27 may include a column decoder, a sense amplifier, and a page buffer that communicate with the memory cell array 26 via a plurality of bit lines BL.

Figure 14:
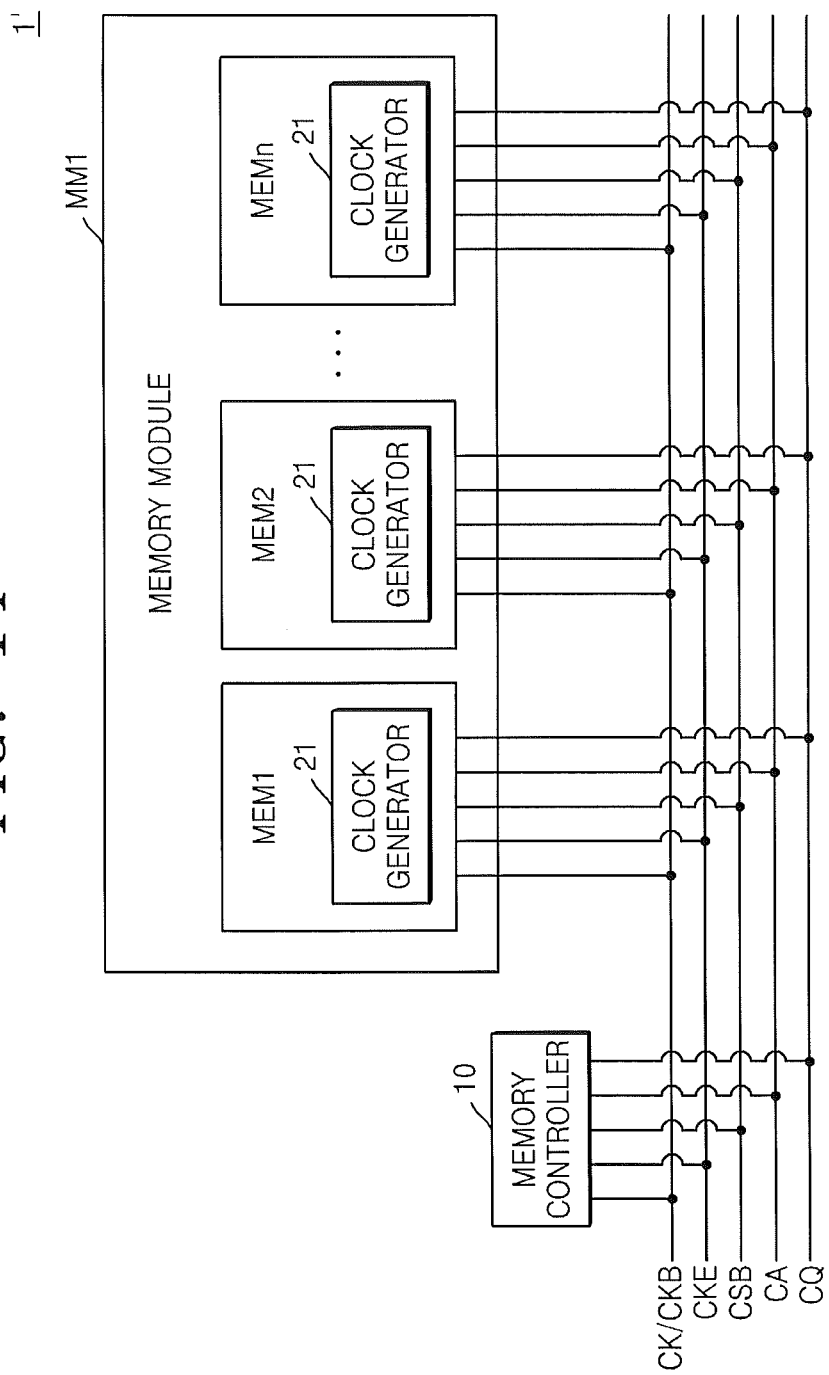
FIG. 14 is a block diagram of a memory system according to another embodiment of the inventive concept.

FIG. 14 is a block diagram of a memory system 1' according to another embodiment of the inventive concept.

Referring to FIG. 14, the memory system 1' may include a memory controller 10 and a memory module MM1. Although FIG. 14 illustrates one memory module MM1, the memory system 1' may include two or more memory modules. The memory controller 10 and the memory module MM1 may, for example, be disposed on a mother board in the memory system 1'. In the current embodiment, some elements of the memory system 1' are substantially the same as those of the memory system 1 illustrated in FIG. 1. The same elements are denoted by the same reference numerals and are not described again here. The memory system 1' is described below with respect to the differences from the memory system 1 of FIG. 1.

The memory controller 10 may supply a clock signal/inverted clock signal CK/CKB, a clock enable signal CKE, a chip selection signal CSB, a command/address signal CA, and data DQ via a signal line or a system bus. According to another embodiment of the inventive concept, the memory controller 10 may further supply a reference voltage for the command/address signal Vref CA and a reference voltage for the data Vref DQ. The memory controller 10 may comprise, for example, the memory controller 10a of FIG. 3 or the memory controller 10b of FIG. 11.

A plurality of memory devices MEM1, MEM2, ..., MEMn may be included in the memory module MM1. Each of the plurality of memory devices MEM1, MEM2, ..., MEMn may include a clock generator 21 that supplies an internal clock signal ICK. The clock generator 21 may be embodied according to any of the embodiments described above and is thus not described again here.

Figure 15:
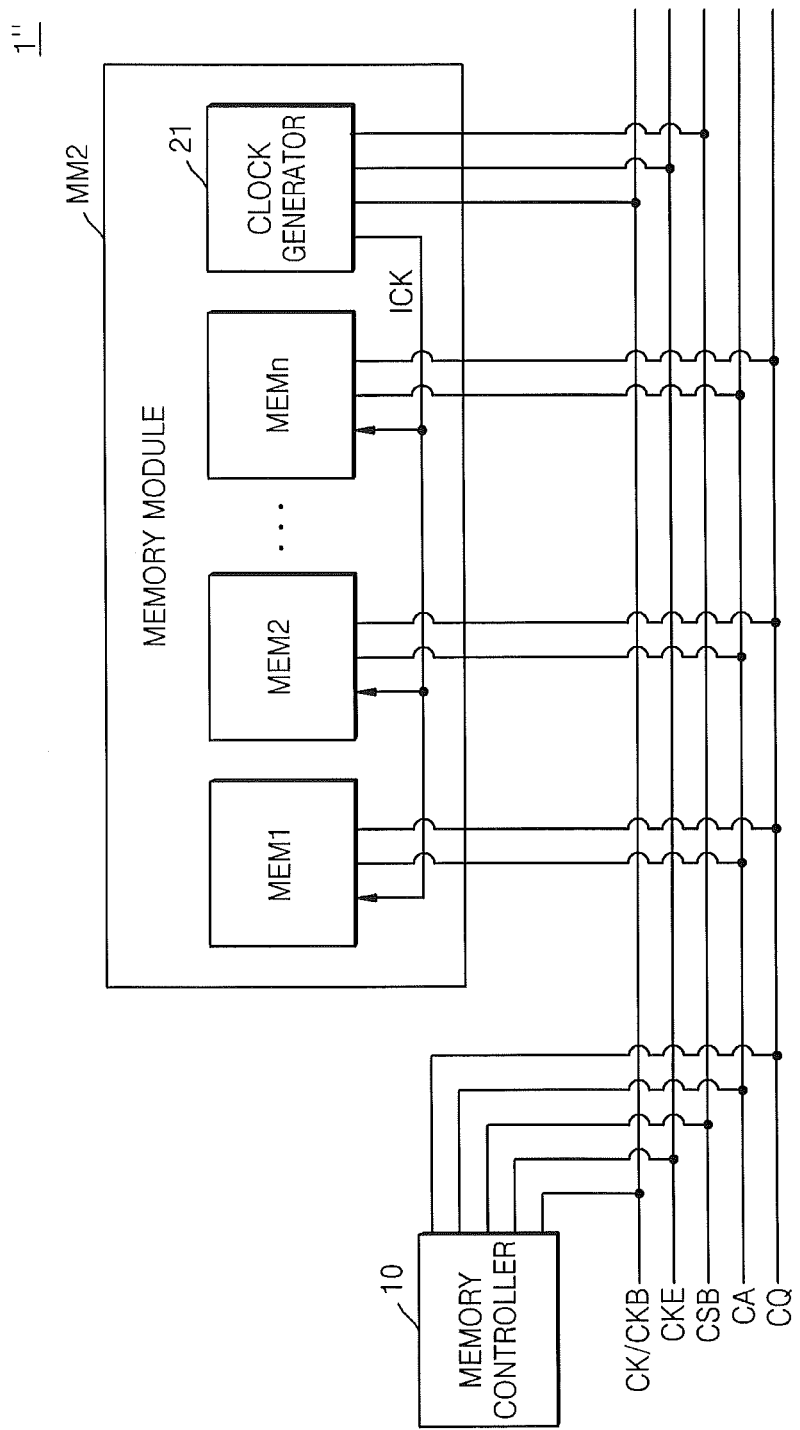
FIG. 15 is a block diagram of a memory system according to yet another embodiment of the inventive concept.

FIG. 15 is a block diagram of a memory system 1" according to another embodiment of the inventive concept.

Referring to FIG. 15, the memory system 1" may include a memory controller 10 and a memory module MM2. Although FIG. 15 illustrates one memory module MM2, the memory system 1" may include two or more memory modules. The memory controller 10 and the memory module MM2 may, for example, be disposed on a mother board in the memory system 1". In the current embodiment, some elements of the memory system 1" are substantially the same as those of the memory system 1 illustrated in FIG. 1. The same elements are denoted by the same reference numerals and are not described again here. The memory system 1" is described below with respect to the differences from the memory system 1 of FIG. 1.

The memory controller 10 may supply a clock signal/inverted clock signal CK/CKB, a clock enable signal CKE, a chip selection signal CSB, a command/address signal CA, and data DQ via a signal line or a system bus. According to another embodiment of the inventive concept, the memory controller 10 may further apply a reference voltage for the command/address signal Vref CA and a reference voltage for the data Vref DQ. The memory controller 10 may comprise, for example, the memory controller 10a of FIG. 3 or the memory controller 10b of FIG. 11.

A plurality of memory devices MEM1, MEM2, ..., MEMn may be included in the memory module MM2. The plurality of memory devices MEM1, MEM2, ..., MEMn may share a clock generator 21 that supplies an internal clock signal ICK. The clock generator 21 may be embodied according to any of the embodiments described above and is thus not described again here.

Figure 16:
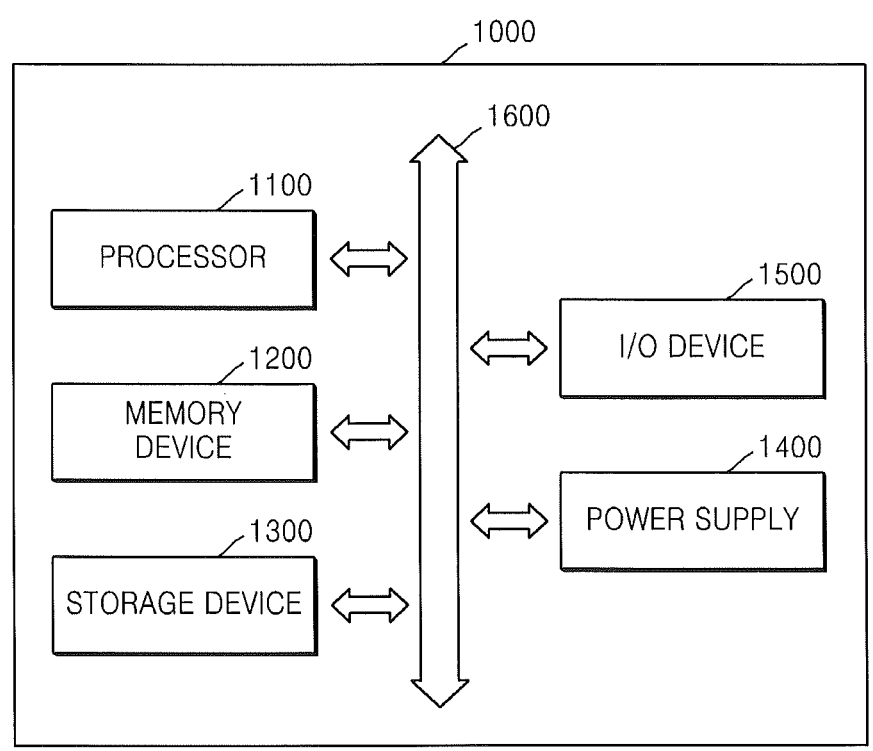
FIG. 16 is a block diagram of a computing system that may include memory devices according to embodiments of the inventive concept.

FIG. 16 is a block diagram of a computing system 1000 according to another embodiment of the inventive concept.

Referring to FIG. 16, the computing system 1000 may include a processor 1100, a memory device 1200, a storage device 1300, a power supply unit 1400 and an I/O device 1500. Although not shown in FIG. 16, the computing system 1000 may communicate with a video card, a sound card, a memory card, or a universal serial bus (USB) device, or may further include ports for communicating with other electronic devices.

The processor 1100 may perform particular calculations or tasks. In some embodiments, the processor 1100 may be a micro-processor or a central processing unit (CPU). The processor 1100 may communicate with the memory device 1200, the storage device 1300, and the I/O device 1500 via a bus 1600, e.g., an address bus, a control bus, or a data bus. According to an embodiment of the inventive concept, the processor 1100 may be connected to an extended bus, e.g., a peripheral component interconnect (PCI) bus.

The memory device 1200 may store data for operating the computing system 1000. For example, the memory device 1200 may be embodied as DRAM, mobile DRAM, SRAM, phase-change RAM (PRAM), ferroelectric RAM (FRAM), resistive RAM (RRAM), and/or magneto-resistive RAM (MRAM). The memory device 1200 may be a memory device or a memory system according to embodiment so of the present invention. Although not shown, the storage device 1300 may include a solid state drive, a hard disk drive, a compact disc (CD)-ROM, or the like.

The power supply unit 1400 may supply operating voltages for operating the computing system 1000. The I/O device 1500 may include input means, e.g., a keyboard, a keypad, and a mouse, and output means, e.g., a printer and a display.

Various embodiments of the inventive concept in which the clock generator 21 is included in the memory device 20 have been described above in detail, but the inventive concept is not limited thereto. The clock generator 21 may be included in a semiconductor device that operates at a clock frequency that is different from an external clock frequency. In this case, the clock generator 21 may be 'off' in the power-down mode of the semiconductor device, thereby reducing the amount of standby current consumed by the semiconductor device.

While the inventive concept has been particularly shown and described with reference to exemplary embodiments thereof, it will be understood that various changes in form and details may be made therein without departing from the spirit and scope of the following claims.

What is claimed is:

1. A semiconductor memory device comprising:
a clock input buffer that is turned 'on' or 'off' in response to a first control signal, the clock input buffer configured to buffer a clock signal in order to output a buffered clock signal; and
an internal clock generator that is configured to generate an internal clock signal in response to the buffered clock signal, wherein the generation of the internal clock signal is started in response to a second control signal.

2. The semiconductor memory device of claim 1, wherein a pulse width of the first pulse of the chip selection signal is greater than one clock cycle of the clock signal.

3. The semiconductor memory device of claim 1, wherein, the internal clock generator is configured to start to generate the internal clock signal by dividing the buffered clock signal in response to the first pulse of the second control signal being input to the internal clock generator while the first control signal is activated.

4. The semiconductor memory device of claim 1, wherein the clock input buffer buffers the clock signal in response to activation of the first control signal.

5. The semiconductor memory device of claim 1, further comprising a clock input buffer controller that is configured to turn the clock input buffer 'on' and 'off' in response to the first clock signal.

6. The semiconductor memory device of claim 5, further comprising an internal clock generation controller that is configured to turn the internal clock generator 'on' and 'off' in response to the first control signal.

7. The semiconductor memory device of claim 1, wherein the first control signal is a clock enable signal, the second control signal is a chip selection signal, and further comprising a command/address buffer that is configured to buffer a command/address signal in synchronization with the internal clock signal.

8. The semiconductor memory device of claim 7, wherein the chip selection signal comprises a first pulse that is provided to the internal clock generator to initiate generation of the internal clock signal, and a second pulse that is subsequent to the first pulse, and
the command/address buffer receives the command/address signal when the second pulse of the chip selection signal is input to the internal clock generator.

9. The semiconductor memory device of claim 8, wherein the clock signal includes a first clock cycle that corresponds to a point of time when the first pulse of the chip selection signal occurs and a second clock cycle that occurs an even number of clock cycles after the first clock cycle, the second clock being within a period where the second pulse of the chip selection signal is maintained.

10. The semiconductor memory device of claim 1 in combination with a memory controller that is configured to generate the clock signal, the first control signal and the second control signal, the semiconductor memory device and the memory controller comprising a memory system, wherein the semiconductor memory device is configured to start generating the internal clock signal in response to a first pulse of the second control signal being input to the semiconductor memory device when the first control signal is activated.

11. The memory system of claim 10, wherein the second control signal is a chip selection signal, and wherein the chip selection signal further includes a second pulse that is subsequent to the first pulse, and the clock signal includes a first clock cycle that corresponds to a point of time when the first pulse of the chip selection signal occurs and a second clock cycle that occurs an even number of clock cycles after the first clock cycle, the second clock cycle being within a period where a second pulse of the chip selection signal is maintained.

12. The memory system of claim 11, wherein the memory controller further comprises a command/address supply unit for supplying a command/address signal to the semiconductor memory device in synchronization with the second clock cycle of the clock signal.

13. The memory system of claim 10, wherein the memory controller further comprises a pulse width controller for controlling a pulse width of the first pulse of the second control signal to be greater than one clock cycle of the clock signal.

14. The semiconductor memory device of claim 1 in combination with a memory controller that is configured to generate and supply the first control signal, the second control signal and a command signal to the semiconductor memory device, wherein the semiconductor memory device includes a memory cell array and is configured to have a normal operating mode and a power-down operating mode; and wherein the semiconductor memory device is configured to switch from the power-down operating mode to the normal operating mode in response to the first control signal, and wherein the semiconductor memory device is configured to generate the internal clock signal in response to the second control signal such that the command signal is received in synchronization with the internal clock signal.

15. The semiconductor memory system of claim 14, wherein the semiconductor memory device is configured so that a clock input buffer of the semiconductor memory device is turned on in response to activation of the first control signal.

16. The semiconductor memory system of claim 15, wherein the semiconductor memory device is further configured so that the internal clock generator of the semiconductor memory device is turned on in response to activation of the first control signal.

17. The semiconductor memory system of claim 16, wherein the internal clock generator is configured to start dividing the buffered clock signal in response to activation of a first pulse of the second control signal.

18. The semiconductor memory system of claim 16, wherein the memory controller outputs the command signal in response to activation of a second pulse of the second control signal.

* * * * *